United States Patent
Hai

(10) Patent No.: US 6,218,698 B1
(45) Date of Patent: *Apr. 17, 2001

(54) APPARATUS AND METHOD FOR CONTAINER FLOATING GATE CELL

(75) Inventor: Tran T. Hai, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/135,353

(22) Filed: Aug. 17, 1998

Related U.S. Application Data

(62) Division of application No. 09/044,215, filed on Feb. 27, 1998.

(51) Int. Cl.[7] .................................................. H01L 29/788
(52) U.S. Cl. ............................................. 257/317; 438/257
(58) Field of Search ................................... 257/316, 317; 438/257

(56) References Cited

U.S. PATENT DOCUMENTS

| | | | |
|---|---|---|---|
| 4,812,885 | * 3/1989 | Riemenschneider | 257/316 |
| 4,997,780 | 3/1991 | Tigelaar | 437/43 |
| 5,089,867 | 2/1992 | Lee et al. | 357/23.5 |
| 5,143,860 | 9/1992 | Mitchell et al. | 437/43 |
| 5,175,120 | 12/1992 | Lee | 437/48 |
| 5,192,702 | 3/1993 | Tseng | 437/47 |
| 5,192,872 | 3/1993 | Lee | 257/315 |
| 5,278,449 | 1/1994 | Miyakawa | 257/751 |
| 5,281,548 | 1/1994 | Prall | 437/43 |
| 5,292,681 | 3/1994 | Lee et al. | 437/48 |
| 5,340,765 | 8/1994 | Dennison et al. | 437/52 |
| 5,389,808 | * 2/1995 | Ara | 257/316 |
| 5,397,727 | 3/1995 | Lee et al. | 437/43 |
| 5,411,905 | 5/1995 | Acovic et al. | 437/43 |
| 5,444,279 | 8/1995 | Lee | 257/316 |
| 5,510,645 | 4/1996 | Fitch et al. | 257/522 |
| 5,567,635 | 10/1996 | Acovic et al. | 437/43 |
| 5,583,066 | 12/1996 | Jung | 437/43 |
| 5,604,366 | 2/1997 | Lee | 257/316 |
| 5,610,091 | 3/1997 | Cho | 437/43 |
| 5,707,897 | 1/1998 | Lee et al. | 438/258 |
| 5,723,375 | 3/1998 | Ma et al. | 438/258 |
| 5,773,343 | 6/1998 | Lee et al. | 438/259 |
| 5,780,894 | * 7/1998 | Hazama | 257/316 |
| 5,801,415 | 9/1998 | Lee et al. | 257/316 |
| 5,825,073 | 10/1998 | Radosevich et al. | 257/534 |
| 5,843,818 | 12/1998 | Joo et al. | 438/240 |
| 5,851,870 | 12/1998 | Alugbin et al. | 438/239 |
| 5,932,910 | * 8/1999 | Hong | 257/321 |
| 5,986,303 | 11/1999 | Choi, et al. | 257/320 |

* cited by examiner

*Primary Examiner*—David Hardy
(74) *Attorney, Agent, or Firm*—Schwegman, Lundberg, Woessner & Kluth, P.A.

(57) ABSTRACT

A new capacitor structure of a Flash memory (Flash) cells on a supporting substrate's existing topography, including existing topography provided by adjacent word lines is provided. The gate of the Flash memory cell is constructed as an integral part of the new capacitor cell structure. An increased capacitive coupling ratio is achieved whereby reduced programming voltage is required while yielding more a more compact memory cell structure. Hence, the requirements of low power densely packed integrated circuits is realized for smaller, portable microprocessor devices.

25 Claims, 5 Drawing Sheets

APPARATUS AND METHOD FOR CONTAINER FLOATING GATE CELL

This is a divisional application of U.S. patent application Ser. No. 09/044,215, filed on Feb. 27, 1998.

FIELD OF THE INVENTION

The present invention relates generally to semiconductor integrated circuits and, more particularly, to fabrication of a non-volatile memory with a floating gate.

BACKGROUND OF THE INVENTION

Non volatile memories having floating gates are widely implemented on integrated circuits. Flash memory (Flash) is one form of a nonvolatile memory having a floating gate and will be referred to for illustrative purposes throughout this specification. Nevertheless, the present invention is not limited to flash memory cells and can be embodied in any alternate form of non-volatile memory cell having a floating gate.

Flash cells can be electrically programmed, erased, and reprogrammed. One technique of implementing Flash is by use of a floating gate tunneling oxide (FLOTOX) transistor. To create a FLOTOX transistor, a field-effect transistor (FET) having source, drain, substrate, and gate terminals is modified to electrically isolate (float) the gate. This polycrystalline silicon (polysilicon) floating gate is created over a thin insulating layer of silicon dioxide (gate oxide). A second polysilicon gate (control gate) is created above the floating gate. The floating gate and control gate are separated by an interpoly insulating layer.

Since the floating gate is electrically isolated, any charge stored on the floating gate is trapped. Storing sufficient charge on the floating gate will create an inversion channel between source and drain of the FET. Thus, the presence or absence of charge on the floating gate represents two distinct data states.

Typically, FLOTOX transistors are selectively programmed by hot electron injection which places a charge on a floating gate during a write. The FLOTOX transistors are selectively erased by Fowler-Nordheim tunneling which removes the a charge from the floating gate. During a write, a high programming voltage is placed on the control gate. This forces an inversion region to form in the p-type substrate. The drain voltage is increased to approximately half the control gate voltage (6 volts) while the source is grounded (0 volts), increasing the voltage drop between the drain and source. In the presence of the inversion region, the current between the drain and source increases. The resulting high electron flow from source to drain increases the kinetic energy of the electrons. This causes the electrons to gain enough energy to overcome the outside barrier and collect on the floating gate.

After the write is completed, the negative charge on the floating gate raises the cell's threshold voltage ($V_T$) above the wordline logic 1 voltage. When a written cell's wordline is brought to a logic 1 during a read, the cell will not turn on. Sense amps detect and amplify the cell current, and output a 0 for a written cell.

The floating gate can be erased by grounding the control gate and raising the source voltage to a sufficiently high positive voltage to transfer electrons out of the floating gate to the source terminal of the transistor by tunneling through the insulating gate oxide. After the erase is completed, the lack of charge on the floating gate lowers the cell's $V_T$ below the wordline logic 1 voltage. Thus when an erased cell's wordline is brought to a logic 1 during a read, the transistor will turn on and conduct more current than a written cell. Some flash devices use Fowler-Nordheim tunneling for writes as well as erase.

The transistors can be selectively reprogrammed in the same manner as described above, since the Fowler-Nordheim tunneling process is nondestructive. The programming and erasure voltages which effect Fowler-Nordheim tunneling are higher than the voltages normally used in reading the memory. Thus the Fowler-Nordheim tunneling effect is negligible at the lower voltages used in reading the memory, allowing a FLOTOX transistor to maintain its programmed state for years if subjected only to normal read cycles.

These contact-less cells typically require approximately a 12 Volt or higher programming voltage. It would be desirable in future uses of Flash memories to lower the programming voltage (and, therefore, lower the power dissipation) while at the same time increasing Flash cell density.

Flash memory cells typically include a capacitor plate which must be fabricated with a large enough area to retain a charge sufficient to withstand the effects of parasitic capacitances and noise due to circuit operation. A major design goal is to minimize the area of a cell to allow cells to be more densely packed on an integrated circuit die. While achieving this goal of increasing cell array density, however, the sufficient capacitance levels of the storage capacitors must be maintained. To date, smaller cell designs necessitate increasing programming voltages in order to maintain required capacitance levels. Increasing the programming voltage, however, increases power dissipation and future flash memories will require lower power dissipation.

"Stacked storage cell" design's increase cell density without reducing capacitance by employing capacitive coupling. In this technique, two or more capacitor conductive plate layers, such as polycrystalline silicon (polysilicon or poly), are deposited over a memory cell access transistor on a semiconductor wafer. A high dielectric constant material is sandwiched between these capacitor plate layers. Such a capacitor structure is known as a stacked capacitor cell (STC). STC's offer increased cell density, however, advances in conventional methods of high resolution photolithography and anisotropic etching have resulted in the development of other methods for increasing cell capacitance.

One approach to increasing memory cell capacitance in the dynamic random access memory (DRAM) arena is to build a three dimensional capacitor structure which extends vertically upward over the cell area. For example, the Tseng U.S. Pat. No. 5,192,702 discloses a method of fabricating a STC by first depositing an etch stop layer over the word lines. A thick layer of conductively doped polysilicon is then deposited, masked, and etched to form a hollow cylindrical STC bottom capacitor plate of height determined by the polysilicon thickness.

In another approach in the DRAM technologies, a form is employed to create the STC. For example, in the Dennison et al. U.S. Pat. No. 5,340,765 a thick silicon dioxide (oxide) layer is deposited on the supporting substrate on which access transistors have been created. The oxide is then planarized and buried contact openings to the access transistors are etched through the oxide. The buried contact openings are used as forms for the conformal deposition of a conductively doped polysilicon STC bottom plate layer. However, the forming of the buried contact openings is confined to the area between adjacent word lines, thereby limiting the area available for depositing the conductive bottom plate layer of the STC capacitor. By limiting the conductive bottom plate electrode area, the capacitance of the memory storage capacitor is also limited.

Thus, there is a need in the art of Flash memory design, for memory cell structures that yield higher capacitive coupling ratios. A method is likewise needed to fabricate nonvolatile high density Flash memory cell structures which yield even higher capacitance coupling ratios and in which the method used to fabricate these structures is compatible with other memory fabrication steps.

SUMMARY OF THE INVENTION

The present invention provides a system an method for forming a non volatile memory structure on a silicon substrate having an existing topography. A planarized isolation layer is formed on the existing topography of the substrate having a top surface. A portion of the planarized isolation layer is removed to form walls extending from the top surface of the planarized isolation layer to the existing topography of the substrate. A gate oxide region layer is formed on and conforming to the existing topography of the substrate. A conductive bottom plate layer is formed on and conforming to the top surface of the planarized isolation layer, the walls of the isolation layer, and the gate oxide layer. A dielectric layer is formed on and conforming to the conductive bottom plate layer. Then, a conductive top plate layer is formed on and conforming to the dielectric layer.

According to another aspect of the present invention, a method for forming a non volatile memory array on a silicon substrate with an existing topography is provided. The method includes forming a floating gate tunneling oxide transistor (FLOTOX). The FLOTOX has a first and a second source/drain region and a body region. A floating gate is formed as part of the FLOTOX. Forming the floating gate further includes forming a planarized isolation layer on the existing topography of the substrate. The planarized isolation layer has a top surface. The method further includes removing a portion of the planarized isolation layer to form walls which extend from the top surface of the planarized isolation layer to the existing topography of the substrate. A gate oxide region layer is formed on and conforming to the existing topography of the substrate. A floating gate is formed on and to conforms to the top surface of the planarized isolation layer, the walls of the isolation layer, and the gate oxide layer. Forming the floating gate further includes forming a dielectric layer on and conforming to the floating gate. A control gate is formed that to conform to the dielectric layer. A wordline is formed and coupled to the control gate. A bit line is formed and coupled to the second source/drain region. A source line is formed and coupled to the first source/drain region.

According to another aspect of the present invention, a non volatile memory cell structure on a silicon substrate with an existing topography is provided. The non volatile memory cell structure includes a gate oxide region layer on and conforming to the existing topography of the substrate. A planarized isolation layer surrounds the gate oxide region layer having a top surface. An opening extends from the top surface of the planarized isolation layer to the gate oxide region and is defined by the walls interior to the planarized isolation layer. A conductive bottom plate layer is located on and conforming to the top surface of the planarized isolation layer, the interior walls of the planarized isolation layer, and the gate oxide region. A dielectric layer is located on and conforms to the conductive bottom plate layer. A conductive top plate layer is located on and conforms to the dielectric layer.

According to another aspect of the present invention, a non volatile memory cell array structure on a silicon substrate with existing topography is provided. The array includes a number of floating gate tunneling oxide transistors (FLOTOX) located on the substrate's existing topography. Each FLOTOX includes a first and second source/drain region, a body region, and a gate oxide region layer on and conforming to the body region. There is also a planarized isolation layer surrounds the gate oxide region layer and has a top surface. An opening extends from the top surface of the planarized isolation layer to the gate oxide region and defined by walls interior to the planarized isolation layer. A floating gate is located on and conforms to the top surface of the planarized isolation layer, the walls of the isolation layer, and the gate oxide layer. A dielectric layer is located on and conforms to the floating gate. A control gate is located on and conforms to the dielectric layer. A wordline couples to the control gate of each FLOTOX. A bit line couples to the second source/drain region and a source line couples to the first source/drain region.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE PREFERRED EMBODIMENTS

Figure 1:
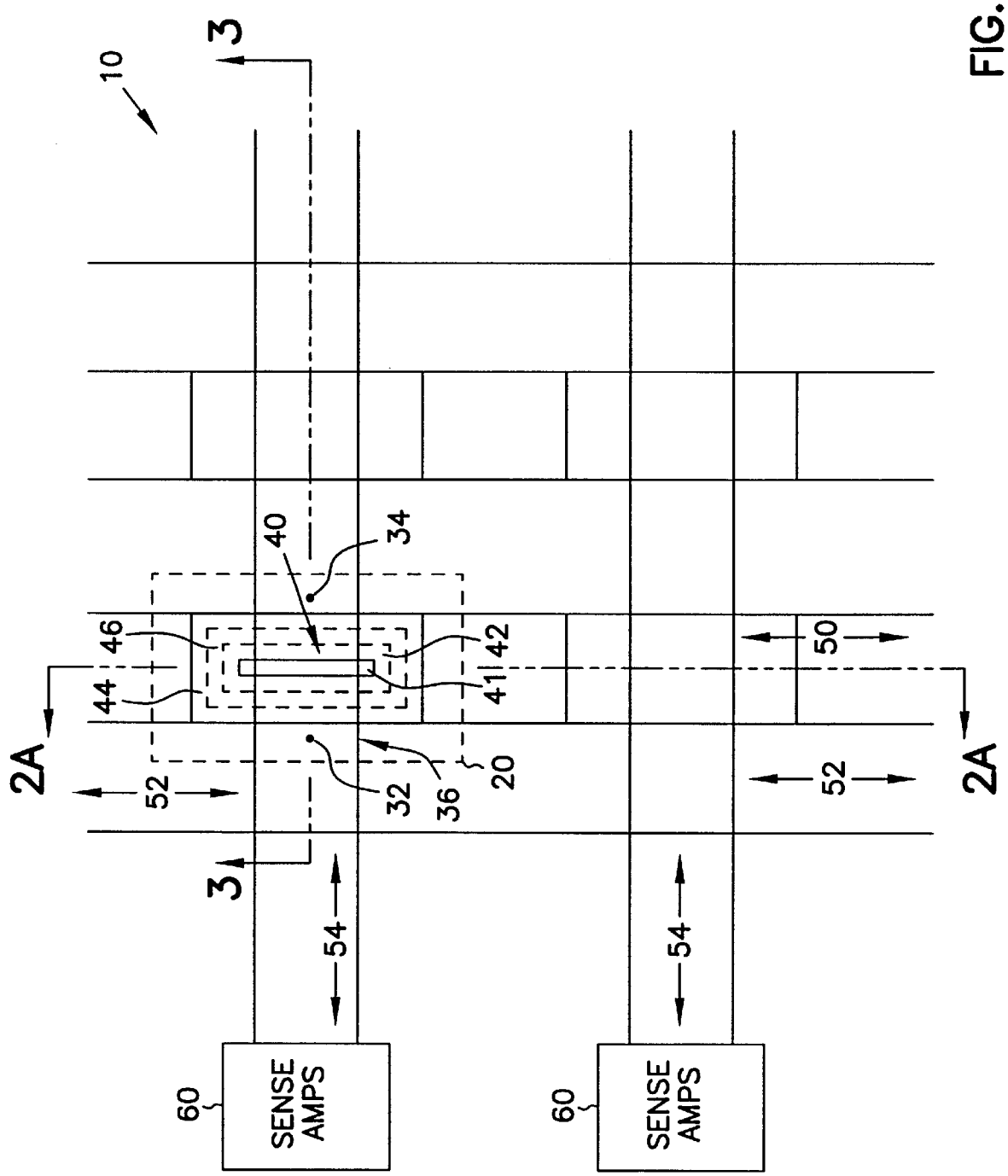
FIG. 1 is a top view of the Flash memory cell layout showing the layout of the cell in relation to the active regions of an integrated circuit.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

A structure, method for fabrication and method for operation of a non volatile memory cell having a floating gate, according to the present invention, is described in detail below. A flash memory cell, which is one form of a non volatile memory cell having a floating gate, is referenced throughout the description as an illustrative example. The present invention is not, however, limited to flash memory cells, but rather is fully applicable to any non volatile memory having a floating gate.

Array Structure

In FIG. 1, a top view of an array 10 of non volatile memory cells is illustrated which together comprise an integrated circuit. The array 10, as illustrated, includes a number of floating gate tunneling oxide transistors (FLOTOX) 20, having a first 32 and second 34 source/drain regions, having a body region 36, a gate oxide layer 41 and a flash memory cell 40. The flash memory cell 40 includes a floating gate 42 and a control gate 44 and a dielectric layer 46 sandwiched between the floating gate 42 and the control gate 44. FIG. 1 further illustrates wordlines 50, wherein the wordlines couple to the control gate 44. Source line 52 couples to the first source/drain region 32. Bit line 54 couples to the second source/drain region 32. Bit lines also couple to sense amps 60.

Method of Operation

The method of operation in the present invention includes programming the flash memory cell 40 through the use of hot electron injection. To achieve this, the wordline 50 is brought to a high programming voltage. This forces an inversion region to form in the body region 36 of the FLOTOX 20. A voltage of approximately half the wordline 50 voltage is placed on the second source/drain region 34. The first source/drain region 32 is held at ground, thus increasing the voltage drop between the first 32 and second 34 source/drain regions. In the presence of the inversion region, the current between the first 32 and second 34 source/drain regions increases. The resulting high electron flow from first 32 to second 34 source/drain regions increases the kinetic energy of the electrons. This causes the electrons to gain enough energy to overcome the gate oxide layer 41 barrier and collect on the floating gate 42.

In one embodiment the wordline 50 is raised to approximately 12 volts and the second source/drain region 54 is raised to approximately 6 volts. Meanwhile, the first source/drain region 52 is grounded, 0 volts.

After the programming is completed, the negative charge on the floating gate 42 raises the flash memory cell's 40 threshold voltage ($V_T$) above the wordline 50 logic "1" voltage. When a programmed cell's wordline 50 is brought to a logic "1" during a read, the flash memory cell 40 will not turn on. Sense amps 60 detect and amplify the cell current, and output a 0 for a written cell.

The floating gate 42 can be erased by grounding the control gate 44 and raising the first source/drain region 32 voltage to a sufficiently high positive voltage to transfer electrons out of the floating gate 42 to the first source/drain region 32 of the FLOTOX 20 by tunneling through the gate oxide layer 41. After the erase is completed, the lack of charge on the floating gate 42 lowers the flash memory cell's 40 $V_T$ below the wordline 50 logic "1" voltage. Thus when an erased flash memory cell's 40 wordline 50 is brought to a logic "1" during a read, the FLOTOX 20 transistor will turn on and conduct more current than a programmed flash memory cell 40. The sense amps 60 detect and amplify the flash memory cell 40 current. In one embodiment, the method of operation for Fowler Nordheim erase functions is reversed and utilized to program the flash memory cell 40. As is appreciated by those skilled in the art, the array 10 will be complemented with other logic architectures to attain high random access memory (RAM) read performance.

Method of Fabrication

Figure 2A:
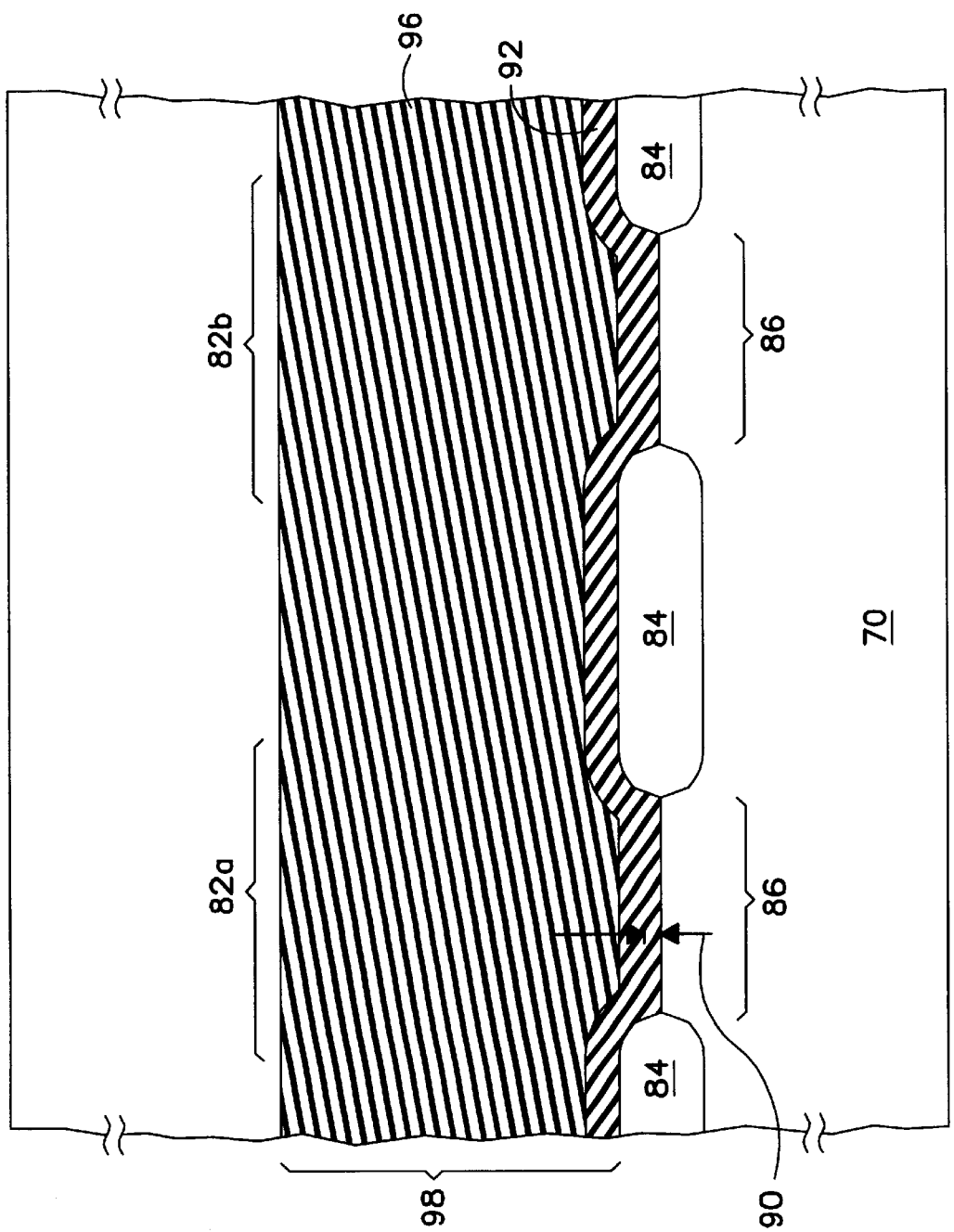
FIGS. 2A–2C illustrate an embodiment of a process of fabrication taken along cut line 2A—2A of FIG. 1.
Figure 2B:
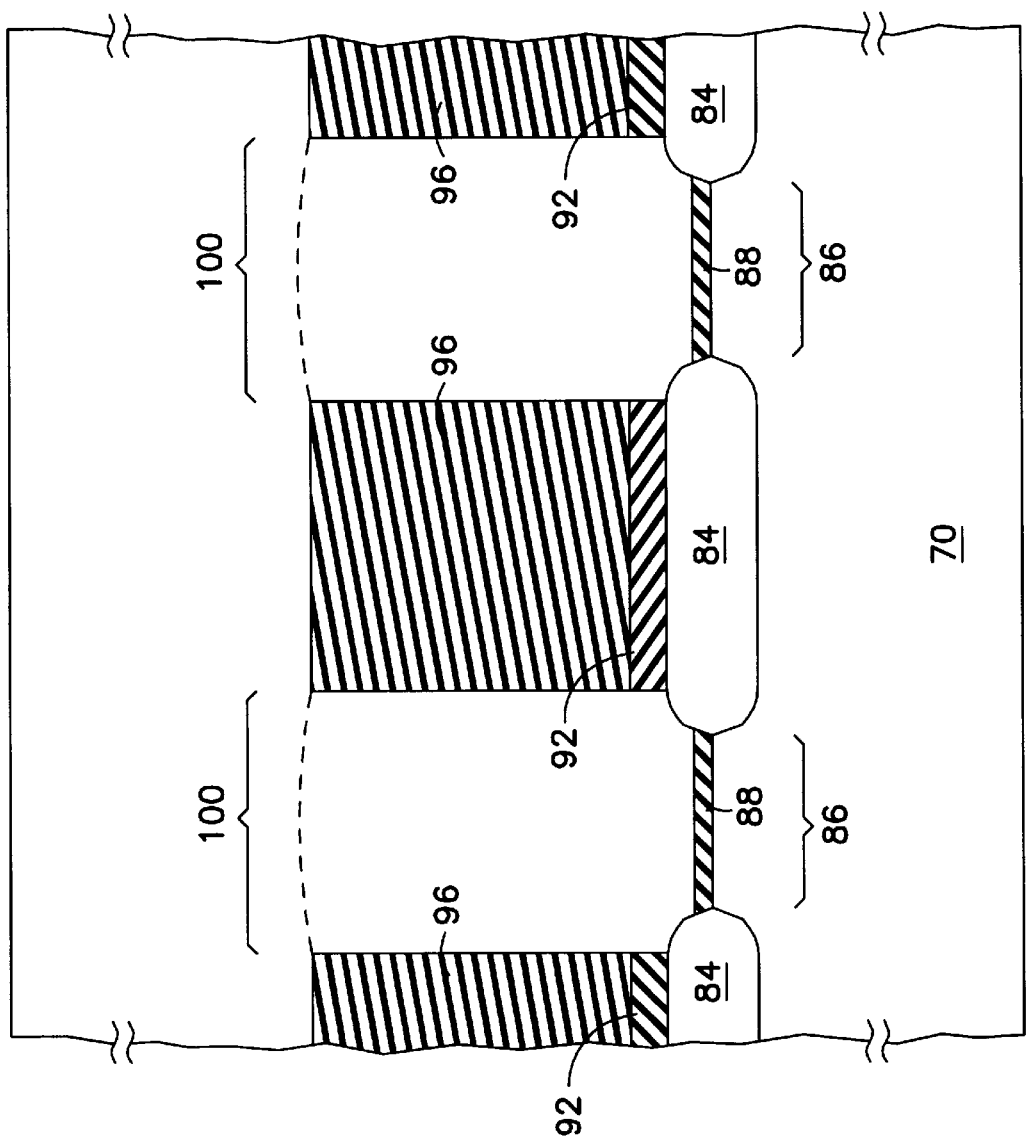
Figure 2C:
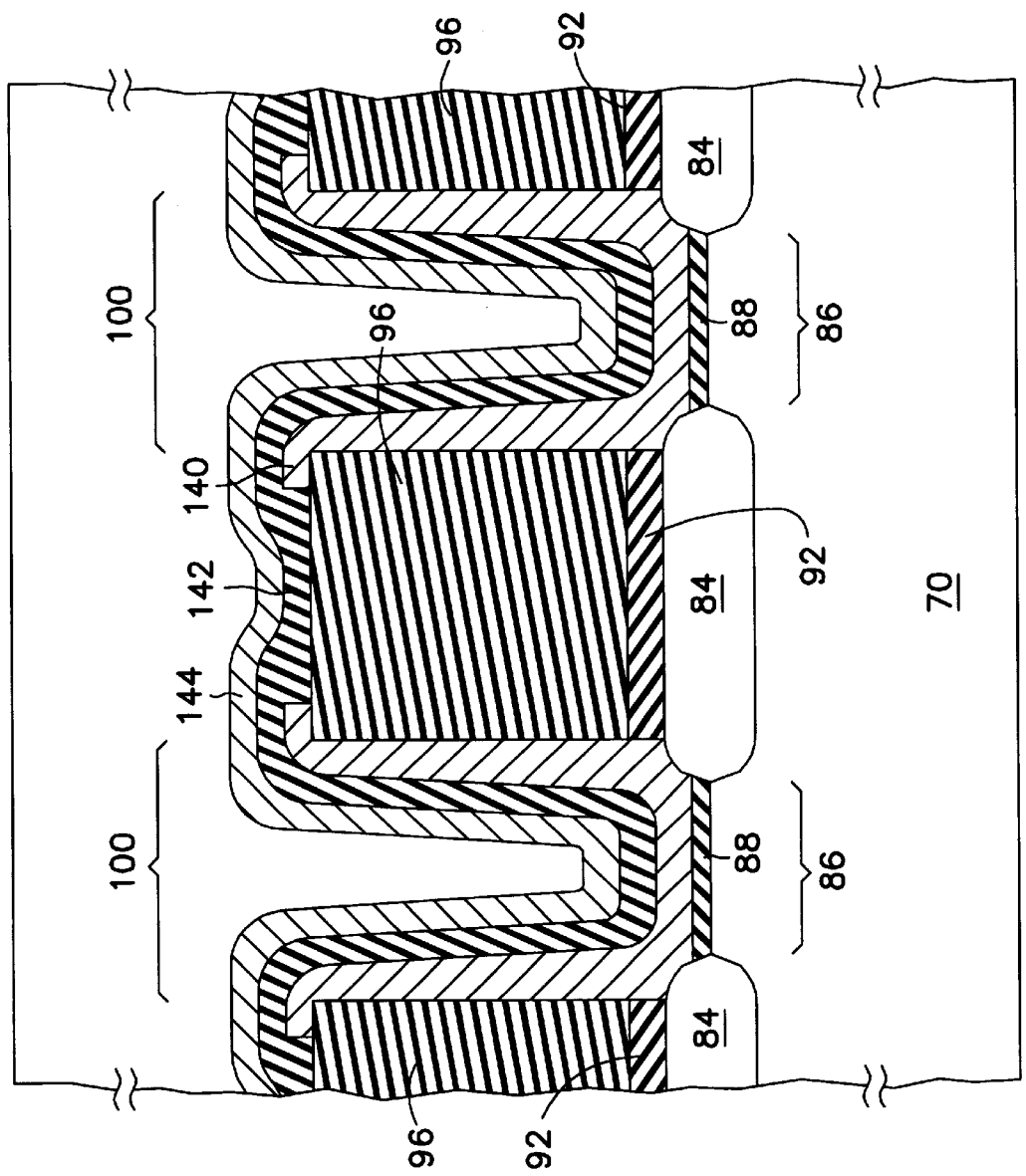

The sequence of fabrication steps, according to the present invention, pertaining to the flash memory cell 40 is illustrated in FIGS. 2A–2C. As will be well understood by one skilled in the art that the FIGS. 2A–2C depict a pair of floating gate and Flash memory elements. Multiple floating gate and Flash memory elements are typically fabricated simultaneously on multiple integrated circuit die on a semiconductor wafer.

FIG. 2A is a cross section view along line 2A—2A of FIG. 1. The cross sectional view of FIG. 2 illustrates a semiconductor substrate 70. Two adjacent Flash cell regions 82a and 82b define the active area regions, where FLOTOX transistors are to be created. Regions of thick insulating silicon dioxide called field oxide form sidewall spacers 84. These sidewall spacers 84 are grown around the active areas 82 thereby completely enclosing the active areas 82 along the surface of the wafer. The sidewall spacers 84 electrically isolates FLOTOX transistors from each other.

In FIG. 2A, a first isolation layer 92 is conformally deposited over the existing topography of supporting substrate 70. The first isolation layer 92 acts as an etch-stop to protect underlying topography. First isolation layer 92 is preferably composed of silicon nitride (nitride), but other layers of materials or combinations of layers of materials with suitable etch stop properties may also be used. For example, first isolation layer 92 could alternatively be composed of undoped polysilicon or undoped silicon dioxide. First isolation layer 92 is preferably conformally deposited by chemical vapor deposition (CVD).

Next, a relatively thick second isolation layer 96 is conformally deposited, preferably by CVD, on the first isolation layer 92. Surface topography of second isolation layer 96 is minimized by planarization, preferably by chemical-mechanical polishing (CMP). Other planarization techniques may also be used, such as by forming and dry-etching a photoresist layer or spin on glass. The second isolation layer 96 is preferably an undoped oxide, such as: tetraethyl orthosilicate (TEOS); silane based oxide; of spin-on glass (SOG). Alternatively, second isolation layer 96 may comprise a doped oxide, such as: borophosphosilicate glass (BPSG); phosphosilicate glass (PSG); or, borosilicate glass (BIG). The etch rate of second isolation layer 96 should be substantially greater than the etch rate of first isolation layer 92. Minimizing the topography of second isolation layer 96 by CMP planarization results in a relatively flat surface for subsequent processing steps. Together the first isolation layer 92 and the second isolation layer 96 collectively comprise a planarized isolation layer 98.

FIG. 2B illustrates the structure following the next sequence of process steps. The second isolation layer 96 is selectively patterned to define a substantially cylindrical opening 100. A substantially cylindrical opening 100 is anisotropically etched through second isolation layer 96 and through portions of the underlying first isolation layer 92. The minimum thickness of first isolation layer 92 also depends on the etchant's selectivity of the second isolation layer 96 with respect to the first isolation layer 92.

In one embodiment, the second isolation layer 96, is controllably etched to remove a certain portion of the second isolation layer 96 and to thereby expose portions of the first isolation layer 92. A dry etch is the technique chosen using, for example, a fluorocarbon-containing plasma, such as $CHF_3$, $CF_4$, or $CHF_4$ or an oxygen plasma process in the typical method of reactive ion etching (RIE). The first isolation layer 92 is next removed in such a manner as to form a continuation of the substantially cylindrical opening 100, terminating on the existing topography of the substrate 70. A wet etch is the technique utilized to remove the first isolation layer 92. In one embodiment, the wet etch is a hot phosphoric acid solution at a temperature of about 160 to 180 degrees Celsius. In another embodiment, a wet etch is performed with hydrogen peroxide, $H_2O_2$, in sulfuric acid, $H_2SO_4$, or by using an organic photoresist stripper.

In an alternative process embodiment, the dry etch process mentioned above is utilized to etch through portions of both the second and first isolation layers, 96 and 92 respectively, in one step.

Gate oxides 88 are formed in the gate oxide regions 86 by thermally oxidizing the surface of the silicon substrate 70. The gate oxides are formed to a desired thickness. The desired thickness to facilitate Fowler-Nordheim tunneling is 150 angstroms or less.

FIG. 2C illustrates the structure following the final sequence of process steps. A bottom conductive layer 140 is blanket deposited, such as by CVD (Chemical Vapor Deposition), over the substantially cylindrical opening 100 that has been formed in the isolation layers 96 and 92. The bottom conductive layer 140 is formed of polysilicon. A photoresist is applied and selectively exposed to cover the substantially cylindrical openings 100. The bottom conductive layer 140 is then removed from the top surface of the second isolation layer 96 between the substantiallly cylindrical openings 100. The bottom conductive layer 140 can be removed by any suitable method, such as by reactive ion etching (RIE). A capacitor dielectric layer 142 is now conformally deposited over the bottom conductive layer 140. The capacitor dielectric layer 142 is typically composed of sandwiched silicon oxide, silicon nitride, and silicon oxide (ONO). In making the ONO dielectric 142, the first or bottom silicon oxide, (O layer) is formed by, for example, exposure to deionized water (DI) to form a native silicon oxide having a thickness of approximately 50 Angstroms. The silicon nitride, (N layer) is formed by LPCVD wherein the gases are ammonia and $SiH_2C_2$, temperature of approximately 760 Degrees Celsius, pressure of approximately 350 mTorr., to give a resulting thickness of between approximately 50 to 70 Angstroms. The top silicon oxide, (O layer) may be formed by exposing the N layer to dry oxygen at about 850 degrees Celsius for about 30 minutes to form a silicon nitride/oxide layer. A top conductive plate layer 144 is formed by depositing a second polysilicon layer on the capacitor dielectric layer 142 including within the substantially cylindrical opening 100.

Figure 3:
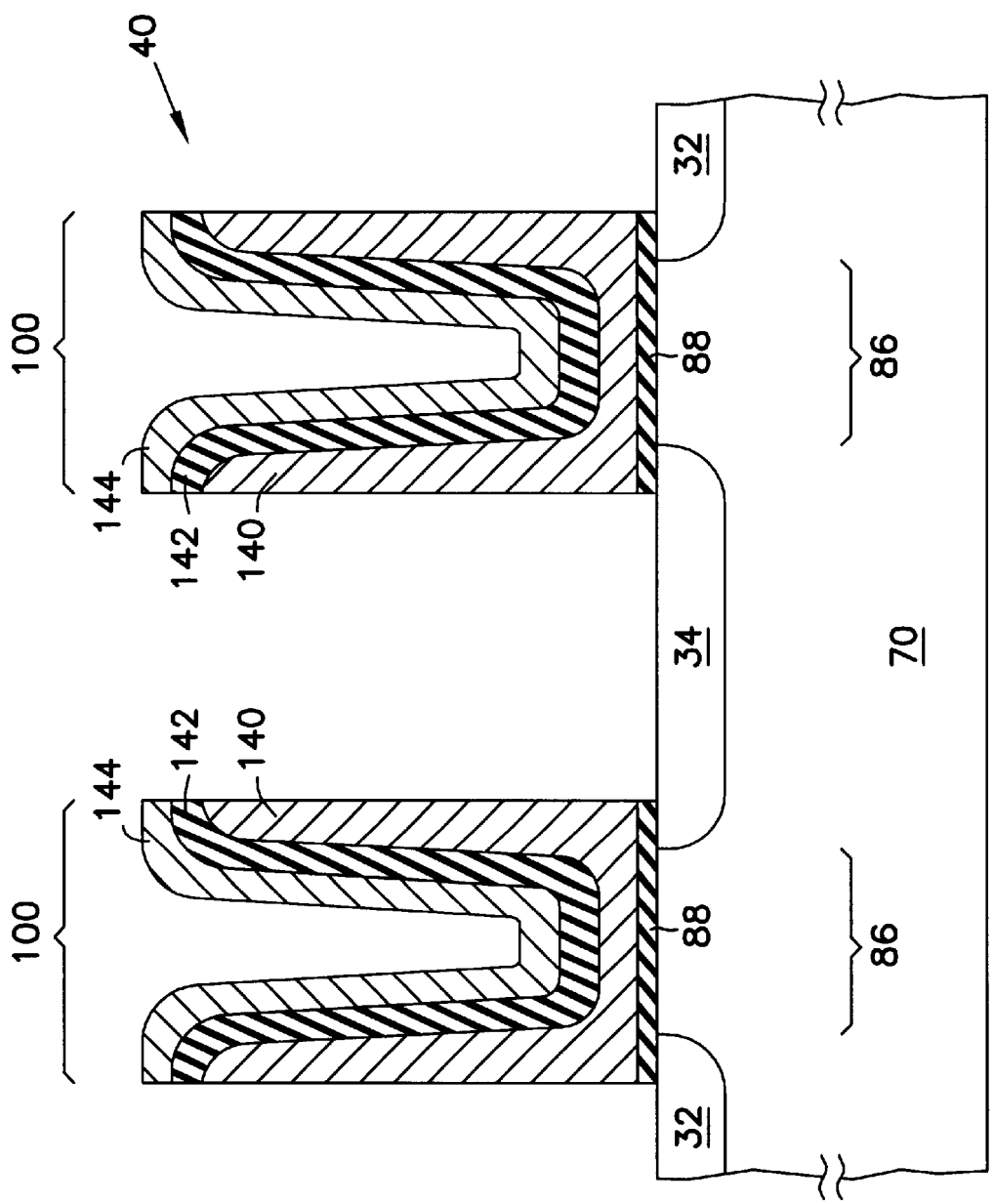
FIG. 3 illustrates a cross sectional view the complete Flash memory cell taken along cut line 3—3 of FIG. 1.

FIG. 3 illustrates a completed view of a pair of flash memory cells 40. The view is taken along cross section line 3—3 of FIG. 1. First 32 and second 34 source/drain regions of the FLOTOX transistor 20 are provided in FIG. 3 for illustrative purposes. The first 32 and second 34 source/drain regions can be formed by any suitable process, as standard processes for such implantation are used in the relevant industry. In one such standard process, the first 32 and second 34 source/drain regions are formed by ion-implantation of dopants into the substrate 70. FIG. 3 illustrates the flash memory cells 40 with the isolation layer removed.

FIG. 3 more clearly illustrates that the new flash memory cell 40 structure utilizes the gate region 86 of in FLOTOX transistor 20 to serve as the flash memory cell 40. The remaining contact holes and wiring required to form the bit lines, wordlines and electrical interconnects of a FLOTOX transistor 20 are achieved through conventional metallization processing steps.

CONCLUSION

A non volatile memory cell having a floating gate is presented which provides a desirably dense cell structure. The new cell structure can be formed on a chip surface area of 4 $F^2$, wherein F is defined as the minimum lithographic feature size that is imposed by lithographic processes used during fabrication. Due to the new cell structure, the capacitive coupling ratio attainable between the floating gate and the control gate is sizeably increased. By increasing the capacitive coupling ratio, the new cell permits lower current consumption designs without requiring an increase in the programming voltage or further reduction in gate oxide thickness below 100 Angstroms. These advantages prove very valuable for hand held and mobile computing systems which require high density, non volatile memory devices and require low power dissipation.

Additionally, a method of fabricating the non volatile memory cell is given. The advantage to the method of the present invention is the method's ability to fabricate an entirely new cell structure without increasing the number or nature of process steps used. Thus, the new structure is advantageously created from the identical number of process steps that is presently standard in fabrication processes for non volatile memories having floating gates.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A non volatile memory cell structure on a silicon substrate having an existing topography, comprising;
   a gate oxide region layer on and conforming to the existing topography of the substrate;
   a planarized isolation layer formed on sidewall spacers surrounding the gate oxide region layer, the planarized isolation layer having a top surface, wherein the planarized isolation layer further includes a masking layer of silicon nitride which serves as an etch stop;
   an opening extending from the top surface of the planarized isolation layer to the gate oxide region and defined by walls interior to the planarized isolation layer;
   a conductive bottom plate layer on and conforming to the top surface of the planarized isolation layer, the interior walls of the planarized isolation layer, and the gate oxide region;
   a dielectric layer on and conforming to the conductive bottom plate layer; and
   a conductive top plate layer on and conforming to the dielectric layer.

2. The non volatile memory cell structure of claim 1, wherein the interior walls of the planarized isolation layer, extending from the top surface of the planarized isolation layer to the gate oxide region, are substantially cylindrical in shape.

3. The non volatile memory cell structure of claim 1, wherein the gate oxide region has a thickness of less than 150 Angstroms.

4. The non volatile memory cell structure of claim 1, wherein the planarization isolation layer comprises tetraethoxysilane (TEOS).

5. The non volatile memory cell structure of claim 1, wherein the conductive bottom plate layer comprises polysilicon, and wherein the conductive bottom plate layer serves as a floating gate.

6. The non volatile memory cell structure of claim 1, wherein the dielectric layer comprises layers of silicon oxide, silicon nitride and silicon oxide (ONO).

7. A non volatile memory cell structure on a silicon substrate having an existing topography, comprising:
- a gate oxide region layer on and conforming to the existing topography of the substrate;
- a planarized isolation layer surrounding gate oxide region layer having a top surface, wherein the planarized isolation layer comprises a masking layer and an oxide layer;
- an opening extending from the top surface of the planarized isolation layer to the gate oxide region and defined by walls interior to the planarized isolation layer;
- a conductive bottom plate layer on and conforming to the top surface of the planarized isolation layer, the interior walls of the planarized isolation layer, and the gate oxide region;
- a dielectric layer on and conforming to the conductive bottom plate layer; and
- a conductive top plate layer on and conforming to the dielectric layer.

8. The non volatile memory cell structure of claim 7, wherein the interior walls of the planarized isolation layer, extending from the top surface of the planarized isolation layer to the gate oxide region, are substantially cylindrical in shape.

9. The non volatile memory cell structure of claim 7, wherein the gate oxide region has a thickness of less than 150 Angstroms.

10. The non volatile memory cell structure of claim 7, wherein the planarization isolation layer comprises tetraethoxysilane (TEOS).

11. The non volatile memory cell structure of claim 7, wherein the conductive bottom plate layer comprises polysilicon, and wherein the conductive bottom plate layer serves as a floating gate.

12. The non volatile memory cell structure of claim 7, wherein the dielectric layer comprises layers of silicon oxide, silicon nitride and silicon oxide (ONO).

13. A non volatile memory cell structure on a silicon substrate having an existing topography, comprising:
- a gate oxide region layer on and conforming to the existing topography of the substrate;
- a planarized isolation layer surrounding gate oxide region layer having a top surface, wherein the planarized isolation layer comprises a masking layer and an oxide layer, wherein the masking layer comprises silicon nitride;
- an opening extending from the top surface of the planarized isolation layer to the gate oxide region and defined by walls interior to the planarized isolation layer;
- a conductive bottom plate layer on and conforming to the top surface of the planarized isolation layer, the interior walls of the planarized isolation layer, and the gate oxide region;
- a dielectric layer on and conforming to the conductive bottom plate layer; and
- a conductive top plate layer on and conforming to the dielectric layer.

14. A non volatile memory cell array structure on a silicon substrate having an existing topography, comprising:
- a plurality of floating gate tunneling oxide transistors (FLOTOX) located on the substrate's existing topography, wherein each FLOTOX comprises:
  - a first and second source/drain region;
  - a body region;
  - a gate oxide region layer on and conforming to the body region;
  - a planarized isolation layer formed on sidewall spacers surrounding the gate oxide region layer, the planarized isolation layer having a top surface, and wherein the planarized isolation layer comprises a masking layer of silicon nitride which acts as an etch stop;
  - an opening extending from the top surface of the planarized isolation layer to the gate oxide region and defined by walls interior to the planarized isolation layer;
  - a floating gate on and conforming to the top surface of the planarized isolation layer, the walls of the isolation layer, and the gate oxide layer;
  - a dielectric layer located on and conforming to the floating gate; and
  - a control gate is located on and conforms to the dielectric layer;
- a wordline, wherein the wordline couples to the control gate;
- a bit line, wherein the bit line couples to the second source/drain region; and
- a source line, wherein the source line couples to the first source/drain region.

15. The non volatile memory cell array structure of claim 14, wherein the interior walls of the planarized isolation layer, extending from the top surface of the planarized isolation layer to the gate oxide region, are substantially cylindrical in shape.

16. The non volatile memory cell array structure of claim 14, wherein the gate oxide region has a thickness of less than 150 Angstroms.

17. The non volatile memory cell array structure of claim 14, wherein the planarization isolation layer further includes an oxide layer which comprises tetraethoxysilane (TEOS).

18. The non volatile memory cell array structure of claim 14, wherein the floating gate and the control gate comprise polysilicon.

19. The non volatile memory cell array structure of claim 14, wherein the dielectric layer comprises layers of silicon oxide, silicon nitride and silicon oxide (ONO).

20. A non volatile memory cell structure on a silicon substrate having an existing topography, comprising;
- a gate oxide region layer on and conforming to the existing topography of the substrate;
- a planarized isolation layer surrounding gate oxide region layer having a top surface, wherein the planarized isolation layer comprises a masking layer and an oxide layer;
- an opening extending from the top surface of the planarized isolation layer to the gate oxide region and defined by walls interior to the planarized isolation layer, wherein the interior walls of the planarized isolation layer, extending from the top surface of the planarized isolation layer to the gate oxide region, are substantially cylindrical in shape;

a conductive bottom plate layer on and conforming to the top surface of the planarized isolation layer, the interior walls of the planarized isolation layer, and the gate oxide region;

a dielectric layer on and conforming to the conductive bottom plate layer; and a conductive top plate layer on and conforming to the dielectric layer.

21. The non volatile memory cell structure of claim 20, wherein the gate oxide region has a thickness of less than 150 Angstroms.

22. The non volatile memory cell structure of claim 20, wherein masking layer comprises silicon nitride and wherein in the oxide layer comprises tetraethoxysilane (TEOS).

23. The non volatile memory cell structure of claim 20, wherein the conductive bottom plate layer comprises polysilicon, and wherein the conductive bottom plate layer serves as a floating gate.

24. The non volatile memory cell structure of claim 20, wherein the dielectric layer comprises layers of silicon oxide, silicon nitride and silicon oxide (ONO).

25. The non volatile memory cell structure of claim 20, wherein the conductive top plate layer comprises polysilicon, and wherein the conductive top plate layer serves as a control gate.

* * * * *

UNITED STATES PATENT AND TRADEMARK OFFICE
CERTIFICATE OF CORRECTION

PATENT NO. : 6,218,698 B1
DATED : April 17, 2001
INVENTOR(S) : Hai

It is certified that error appears in the above-identified patent and that said Letters Patent is hereby corrected as shown below:

<u>Title page,</u>
In the title, delete "APPARATUS AND METHOD FOR CONTAINER FLOATING GATE CELL" and insert -- MEMORY CELL STRUCTURE --, therefor.
In the 8th line of the Abstract, delete the first instance of "more".

<u>Column 1,</u>
Line 44, delete "the a charge" and insert -- the charge --, therefor.

<u>Column 3,</u>
Line 15, delete "an method" and insert -- and method --, therefor.
Line 45, delete "and to conforms" and insert -- and conforms --, therefor.
Line 50, delete " to conform" and insert -- conforms --, therefor.

<u>Column 4,</u>
Line 12, delete "surrounds" and insert -- surrounding --, therefor.

<u>Column 6,</u>
Line 48, delete "of" and insert -- or --, therefor.

<u>Column 7,</u>
Line 34, delete "substantiallly" and insert -- substantially --, therefor.

<u>Column 8,</u>
Line 2, delete "in".

Signed and Sealed this

Sixth Day of November, 2001

Attest:

*Nicholas P. Godici*

NICHOLAS P. GODICI
*Attesting Officer*    *Acting Director of the United States Patent and Trademark Office*